(12) United States Patent
Humphrey et al.

(10) Patent No.: US 9,825,000 B1
(45) Date of Patent: Nov. 21, 2017

(54) SEMICONDUCTOR WIRE BONDING MACHINE CLEANING DEVICE AND METHOD

(71) Applicant: International Test Solutions, Inc., Reno, NV (US)

(72) Inventors: Alan E. Humphrey, Reno, NV (US); Wayne C. Smith, Reno, NV (US); Janakraj Shivlal, Singapore (SG); Bret A. Humphrey, Reno, NV (US)

(73) Assignee: International Test Solutions, Inc., Reno, NV (US)

( * ) Notice: Subject to any disclaimer, the term of this patent is extended or adjusted under 35 U.S.C. 154(b) by 0 days.

(21) Appl. No.: 15/495,873

(22) Filed: Apr. 24, 2017

(51) Int. Cl.
| | | |
|---|---|---|
| *B23K 31/02* | (2006.01) | |
| *B23K 37/00* | (2006.01) | |
| *H01L 23/00* | (2006.01) | |
| *B23K 20/00* | (2006.01) | |
| *B23K 20/26* | (2006.01) | |
| *B23K 101/40* | (2006.01) | |

(52) U.S. Cl.
CPC ............ *H01L 24/85* (2013.01); *B23K 20/005* (2013.01); *B23K 20/26* (2013.01); *H01L 24/78* (2013.01); *B23K 2201/40* (2013.01); *H01L 2224/7801* (2013.01); *H01L 2224/78101* (2013.01); *H01L 2224/78611* (2013.01); *H01L 2224/851* (2013.01); *H01L 2224/85075* (2013.01); *H01L 2224/85203* (2013.01)

(58) Field of Classification Search
CPC . H01L 24/85; H01L 24/78; H01L 2224/7801; H01L 2224/78611; H01L 2224/78101; H01L 2224/85075; H01L 2224/851; H01L 2224/85203; B23K 20/005; B23K 20/26; B23K 2201/40; B23K 20/004; B23K 20/007
USPC ..................................... 228/4.5, 180.5, 904
See application file for complete search history.

(56) References Cited

U.S. PATENT DOCUMENTS

| | | |
|---|---|---|
| 2,971,208 A | 2/1961 | Moore et al. |
| 3,453,677 A | 7/1969 | Cutler |
| 3,675,265 A | 7/1972 | Landen et al. |
| 4,104,755 A | 8/1978 | Smith |
| 4,334,780 A | 6/1982 | Pernick |
| 4,590,422 A | 5/1986 | Milligan |
| 5,011,513 A | 4/1991 | Zador et al. |

(Continued)

FOREIGN PATENT DOCUMENTS

| | | | | |
|---|---|---|---|---|
| CN | 1717285 | | 1/2006 | |
| JP | 58131743 A | * | 8/1983 | ............ B23K 20/007 |

(Continued)

OTHER PUBLICATIONS

International Test Solutions Publication, *Probe Clean™* on *Silicon Wafer*, dated May 2002 (2 pgs.).

(Continued)

*Primary Examiner* — Kiley Stoner
(74) *Attorney, Agent, or Firm* — DLA Piper LLP (US)

(57) ABSTRACT

A methodology and medium for regular and predictable cleaning the support hardware such as capillary tube in semiconductor assembly equipment components, while it is still in manual, semi-automated, and automated assembly are disclosed. The cleaning material may include a cleaning pad layer and one or more intermediate layers that have predetermined characteristics.

30 Claims, 17 Drawing Sheets

(56) References Cited

U.S. PATENT DOCUMENTS

| | | | |
|---|---|---|---|
| 5,205,460 A * | 4/1993 | Sato | B23K 20/26 15/21.1 |
| 5,220,279 A | 6/1993 | Nagasawa | |
| 5,444,265 A | 8/1995 | Hamilton | |
| 5,652,428 A | 7/1997 | Nishioka et al. | |
| 5,685,043 A | 11/1997 | LaManna et al. | |
| 5,690,749 A | 11/1997 | Lee | |
| 5,778,485 A | 7/1998 | Sano et al. | |
| 5,814,158 A | 9/1998 | Hollander et al. | |
| 5,968,282 A | 10/1999 | Yamasaka | |
| 6,019,663 A | 2/2000 | Angell et al. | |
| 6,056,627 A | 5/2000 | Mizuta | |
| 6,118,290 A | 9/2000 | Sugiyama et al. | |
| 6,121,058 A | 9/2000 | Shell et al. | |
| 6,130,104 A | 10/2000 | Yamasaka | |
| 6,170,116 B1 | 1/2001 | Mizuta | |
| 6,183,677 B1 | 2/2001 | Usui et al. | |
| 6,193,587 B1 | 2/2001 | Lin et al. | |
| 6,280,298 B1 | 8/2001 | Gonzales | |
| 6,306,187 B1 | 10/2001 | Maeda et al. | |
| 6,322,433 B1 | 11/2001 | Matsumura | |
| 6,326,413 B1 | 12/2001 | Blackwell et al. | |
| 6,355,495 B1 | 3/2002 | Fujino et al. | |
| 6,366,112 B1 | 4/2002 | Doherty et al. | |
| 6,474,350 B1 | 11/2002 | Mizuta | |
| 6,646,455 B2 | 11/2003 | Maekawa et al. | |
| 6,733,876 B1 | 5/2004 | Beardsley et al. | |
| 6,741,086 B2 | 5/2004 | Maekawa et al. | |
| 6,777,966 B1 | 8/2004 | Humphrey et al. | |
| 6,884,300 B2 | 4/2005 | Sato et al. | |
| 6,888,344 B2 | 5/2005 | Maekawa et al. | |
| 6,960,123 B2 | 11/2005 | Mitarai | |
| 7,202,683 B2 | 4/2007 | Humphrey et al. | |
| 7,254,861 B2 | 8/2007 | Morioka et al. | |
| 7,306,849 B2 | 12/2007 | Buckholtz et al. | |
| 7,530,887 B2 | 5/2009 | Jiang et al. | |
| 7,866,530 B1 * | 1/2011 | Riachentsev | B23K 3/027 219/229 |
| 7,975,901 B2 * | 7/2011 | Maeda | B23K 20/007 134/1.2 |
| 8,371,316 B2 | 2/2013 | Humphrey et al. | |
| 8,790,406 B1 | 7/2014 | Smith | |
| 8,790,466 B2 | 7/2014 | Humphrey et al. | |
| 8,801,869 B2 | 8/2014 | Broz et al. | |
| 9,318,362 B2 * | 4/2016 | Leung | H01L 21/67144 |
| 2001/0007421 A1 | 7/2001 | Marcuse et al. | |
| 2002/0028641 A1 | 3/2002 | Okubo et al. | |
| 2002/0096187 A1 * | 7/2002 | Kuwata | B08B 1/04 134/1 |
| 2002/0097060 A1 | 7/2002 | Maekawa et al. | |
| 2003/0076490 A1 | 4/2003 | Clark | |
| 2003/0092365 A1 | 5/2003 | Grube | |
| 2003/0200989 A1 | 10/2003 | Humphrey et al. | |
| 2004/0083568 A1 | 5/2004 | Morioka et al. | |
| 2004/0096643 A1 | 5/2004 | Sato et al. | |
| 2004/0200515 A1 | 10/2004 | Saito et al. | |
| 2005/0001645 A1 | 1/2005 | Humphrey et al. | |
| 2005/0026552 A1 | 2/2005 | Fawcett et al. | |
| 2005/0034743 A1 | 2/2005 | Kim et al. | |
| 2005/0126590 A1 | 6/2005 | Sato et al. | |
| 2005/0255796 A1 | 11/2005 | Haga | |
| 2006/0065290 A1 | 3/2006 | Broz et al. | |
| 2006/0076337 A1 * | 4/2006 | Brunner | B23K 35/02 219/145.21 |
| 2006/0151004 A1 | 7/2006 | Terada et al. | |
| 2006/0219754 A1 * | 10/2006 | Clauberg | B08B 7/00 228/4.5 |
| 2006/0289605 A1 * | 12/2006 | Park | B23K 20/004 228/4.5 |
| 2007/0178814 A1 | 8/2007 | Sato et al. | |
| 2007/0284419 A1 * | 12/2007 | Matlack | B23K 20/1225 228/112.1 |
| 2008/0023028 A1 * | 1/2008 | Fujita | B08B 7/0035 134/1.1 |
| 2008/0070481 A1 | 3/2008 | Tamura et al. | |
| 2008/0242576 A1 | 10/2008 | Tamura et al. | |
| 2009/0212807 A1 | 8/2009 | Chen et al. | |
| 2010/0132736 A1 | 6/2010 | Lin et al. | |
| 2012/0048298 A1 | 3/2012 | Humphrey et al. | |
| 2013/0056025 A1 * | 3/2013 | Widhalm | B29C 65/08 134/6 |

FOREIGN PATENT DOCUMENTS

| | | | |
|---|---|---|---|
| JP | 05211195 A * | 8/1993 | H01L 24/78 |
| JP | H07244074 | 9/1995 | |
| JP | 11145212 | 5/1999 | |
| JP | 2000232125 A * | 8/2000 | H01L 24/78 |
| JP | 2000-332069 | 11/2000 | |
| JP | 2005-326250 | 11/2005 | |
| JP | 2006/13185 | 1/2006 | |
| JP | 2006-165395 | 6/2006 | |
| JP | 2006/186133 | 7/2006 | |
| JP | 2008-070280 | 3/2008 | |
| JP | 2008147551 A * | 6/2008 | H01L 24/78 |
| JP | 2008-270270 A | 11/2008 | |
| JP | 2008270270 A * | 11/2008 | H01L 24/85 |
| JP | 2011-117938 | 6/2011 | |
| JP | 4840118 B2 * | 12/2011 | H01L 24/48 |
| JP | 2014107561 A * | 6/2014 | H01L 24/78 |
| KR | 100392730 B1 * | 7/2003 | H01L 24/78 |
| KR | 100889297 B1 * | 3/2009 | B08B 1/008 |
| TW | 409322 | 10/2000 | |
| WO | WO 98/47663 | 10/1998 | |

OTHER PUBLICATIONS

International Test Solutions Publication, *Probe Clean™ for Use on Prober Abrasion Plates*, dated May 2002 (2 pgs.).

International Test Solutions Publication, *Probe Clean™ Non-Abrasive Method to Clean Loose Debris from Probe Tips*, dated May 2002 (1 pg.).

International Test Solutions Publication, *Probe Polish™ on Silicon Wafer*, dated May 2002 (2 pgs.).

International Test Solutions Publication, *Probe Polish™ for Use on Prober Abrasion Plates*, dated May 2002 (2 pgs.).

International Test Solutions Publication, *Probe Scrub™ Restore Probe Tip Performance and Remove Bonded Debris*, dated May 2002 (1 pg.).

International Test Solutions Publication, *Probe Form™*, dated Jul. 7, 2005 (2 pgs.).

International Test Solutions Publication, *Cleaning Parameters for TEL Probers P8 and P8-XL*, dated printout dated Sep. 18, 2003 http://web.archive.org/web/20030918014522/http://inttest.net/products/PC2002.pdf (3 pgs.).

* cited by examiner

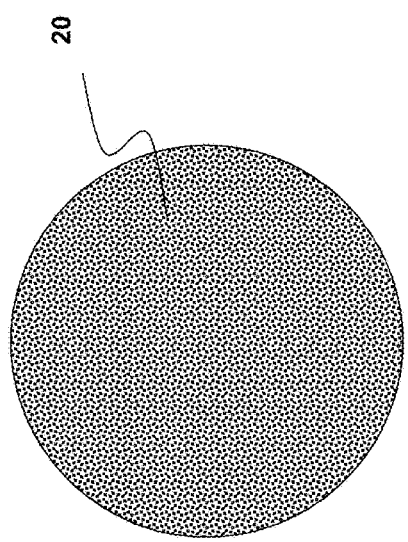
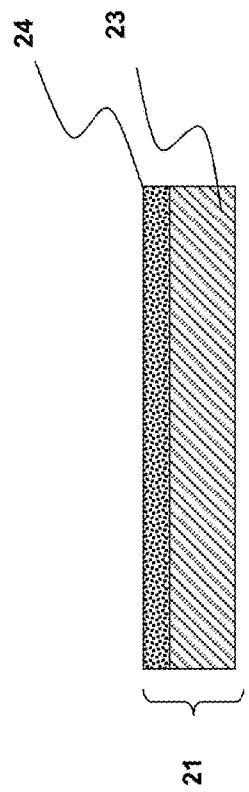
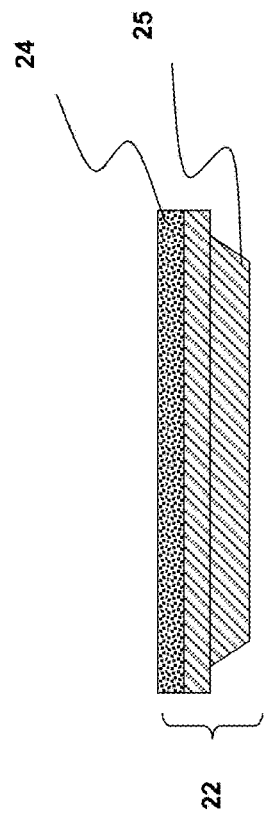
FIGURE 5A
FIGURE 5B
FIGURE 5C

SEMICONDUCTOR WIRE BONDING MACHINE CLEANING DEVICE AND METHOD

FIELD

The disclosure relates generally to a device and method for cleaning semiconductor assembly and wire bonding equipment components.

BACKGROUND

Individual semiconductor devices, such as for example, an integrated circuit or a semiconductor die, are typically produced by creating and assembling the devices (singulated die) into a package or multiple chip package by using well known semiconductor assembly processing techniques that can include, for example, wafer cleaning, wafer taping, dicing, die attachment, wire bonding, molding, lead frame attachment, lead trimming, lead forming and singulation. These semiconductor assembly processes create functional integrated circuit devices (ICs) in an individual package, multi-chip module (MCM), or stack chip assembly.

The fundamentals of a thermal compression with or without ultrasonic assist wire bond process consists of feeding of a thin copper or gold wire through a capillary tube. An electrode or some other mechanism is used to heat the end of the wire extruding from the capillary tube to form a free air ball of molten wire. The capillary tube is lowered towards the semiconductor device and the molten wire ball is compressed between the end of the capillary tube and a heated metal pad or other metal frame producing a mechanical connection that is intended to form a eutectic bond between the wire ball and the bond pad or frame. The capillary tube then may be raised while the wire is fed through the capillary tube leaving the wire ball attached to the die bond pad or frame. The capillary tube may be moved to second location and the thermal compression (with or without ultrasonic assist) wire bond process is repeated at the second location. This wire bonding process is repeated as required to provide electrical connection between the semiconductor device (die) bond pads and frame to provide electrical connection pathways. For example, U.S. Pat. Nos. 7,621,436 and 5,485,949 and https://en.wikipedia.org/wiki/Wire_bonding, all of which are incorporated herein by reference, disclose examples of wire bonding processes and machines.

Various materials may be used to promote the melting of the bond wire and to assist in promoting the formation of the eutectic bond during the bonding process. For example, fluxes may be used to prevent oxidation during the bonding process as well as other materials. During the bonding process, some of these materials form slag and small pieces of the molten bond wire inadvertently stick to the face and side of the capillary tube.

Today the cleaning of the capillary tube is performed by removing the capillary tube from the equipment to be cleaned and/or refurbished. The cleaning and refurbishing of the capillary tube usually consists of a wet chemical process using solvents or corrosive solutions and possibly in conjunction with some mechanical scrubbing process. Thus, the typical process requires the wire bonding process to be stopped while the capillary tube is being cleaned and refurbished. Furthermore, the wet chemical process and mechanical scrubbing process can damage the capillary tube. It is desirable to be able to clean the capillary tube of the wire bonding assembly machine without removing the capillary tube and without using the harsh wet chemical process or mechanical scrubbing process.

BRIEF DESCRIPTION OF THE DRAWINGS

FIG. 5A is a top view of a typical cleaning device with cleaning pad applied to a carrier;

FIG. 5B is a sectional view of a typical cleaning device with a cleaning pad applied to a substrate surface;

FIG. 5C is a sectional view of a typical cleaning device with a cleaning pad applied to an IC package;

DETAILED DESCRIPTION OF ONE OR MORE EMBODIMENTS

Figure 2:
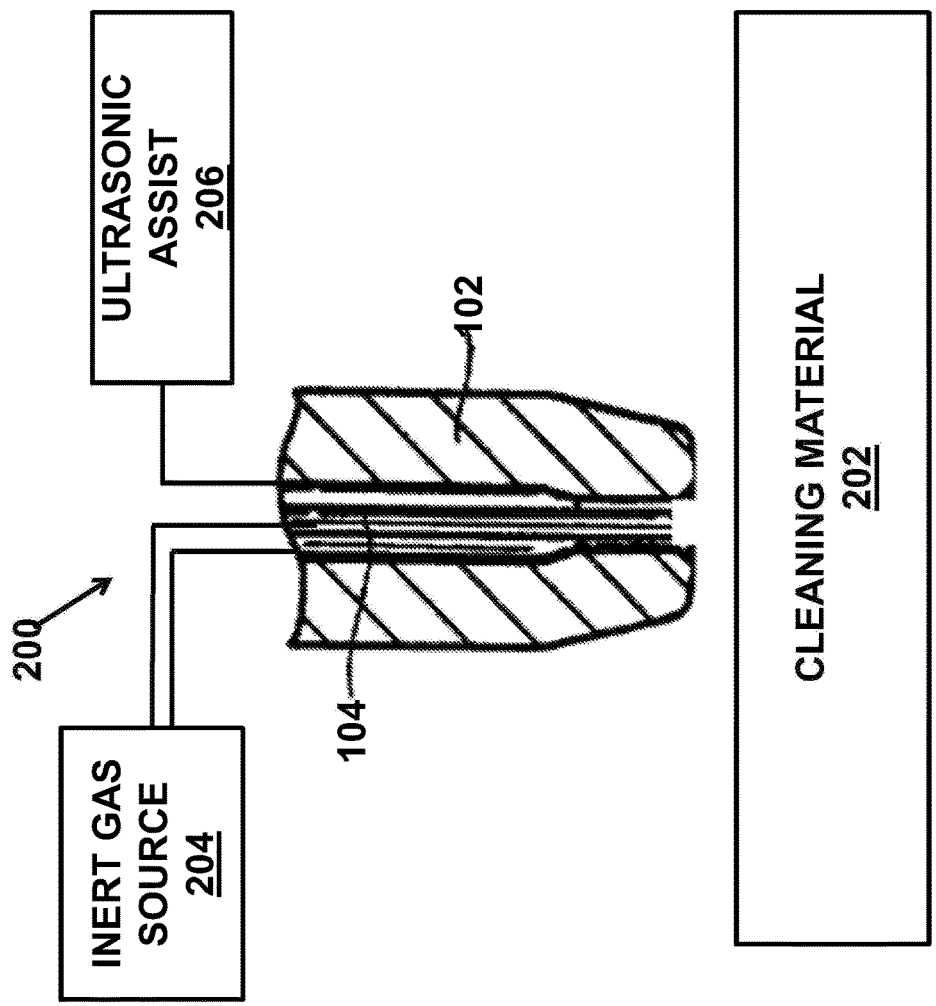
FIG. 2 illustrates a known wire bonding assembly machine having a capillary tube during a cleaning operation using the cleaning material.

The disclosure is particularly applicable to a device, mechanism and method for cleaning the capillary tube of a wire bonding assembly machine (with or without ultrasonic assist wherein the wire bonding assembly machine with an ultrasonic assist 206 is shown in FIG. 2) for semiconductor devices and it is in this context that the disclosure will be described. It will be appreciated, however, that the device, mechanism and method has greater utility since it may be used to clean any device that has a capillary tube that becomes clogged over time with various materials, it can also be used to clean or refurbish other assembly machines and the device, mechanism and method may be implemented using variations of the embodiments disclosed below that are still within the scope of the disclosure.

Figure 1:
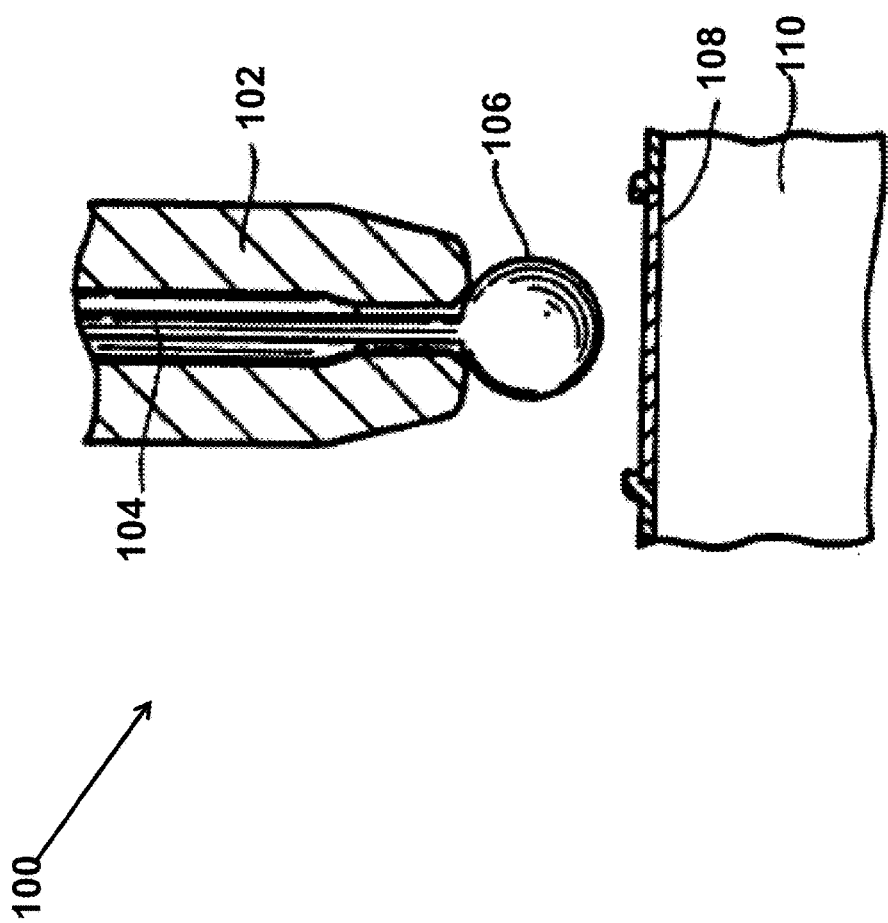
FIG. 1 illustrates a known wire bonding assembly machine having a capillary tube being used for a wire bonding operation.

FIG. 1 illustrates a known wire bonding assembly machine 100 having a capillary tube 102 being used for a wire bonding operation. The wire bonding assembly machine has the various known elements of a wire bonding machine (not shown in FIG. 1) that allow the wire bonding assembly machine to create wire bonds for semiconductor devices and the like. The wire bonding assembly machine may be used to create wire bonds for any device, component, die, etc. in which it is desirable to be able to create wire bonds. FIG. 1 shows a portion of that machine 100 and particularly shows a capillary tube 102 with an outlet and a wire 104, such as cooper or gold, which passes through the capillary tube. The capillary tube 102 is typically removably attached to the wire bonding machine so that, in a conventional cleaning process, the capillary tube may be removed and periodically cleaned and refurbished. The wire bonding machine may have a mechanism (not shown in FIG. 1) that is used to heat an end of the wire extending from the capillary tube to form a free air ball of molten wire 106. The mechanism to heat the wire may be, for example, an electrode or another mechanism. The capillary tube 102 may then be lowered towards a semiconductor device 108 on a substrate 110 and the molten wire ball is compressed between the end of the capillary tube and a heated metal pad or other metal frame producing a mechanical connection that is intended to form an eutectic bond between the wire ball and the bond pad or frame. The capillary tube then may be raised while the wire is fed through the capillary tube leaving the wire ball attached to the die bond pad or frame.

FIG. 2 illustrates a known wire bonding assembly machine having a capillary tube during a cleaning operation 200 using a cleaning material 202. In particular, while the capillary tube 102 remains connected to the wire bonding machine (unlike the typical cleaning process as described above), the end of the capillary tube 102 may be inserted into the cleaning material 202 so that debris inside of the capillary tube and/or adjacent the outlet of the capillary tube 102 may be removed from the capillary tube and trapped/retained in the cleaning material 202.

Figure 3:
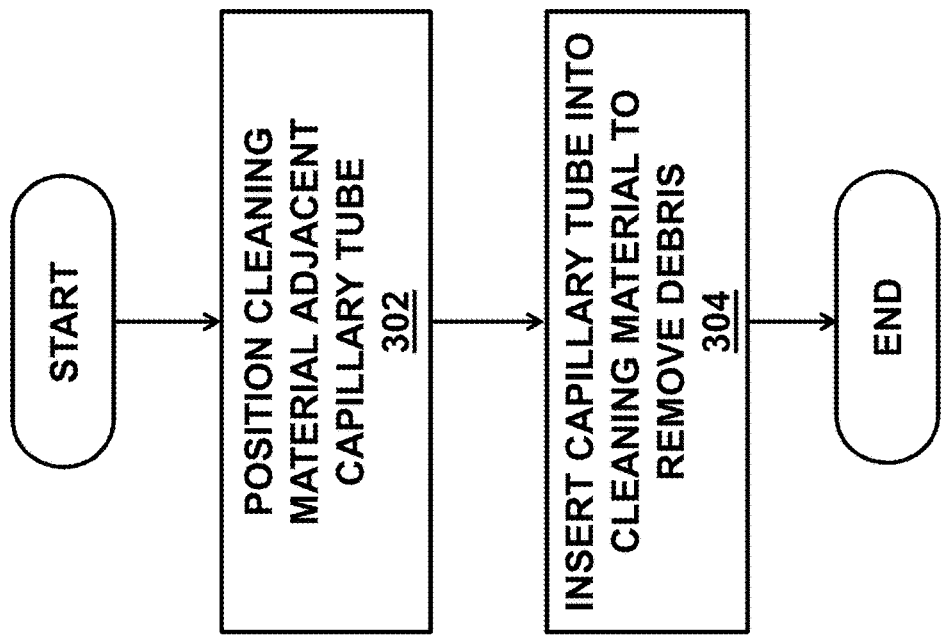
FIG. 3 illustrates a first embodiment of a method for cleaning the capillary tube of the wire bonding assembly machine.
Figure 3:
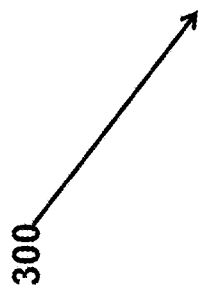

FIG. 3 illustrates a first embodiment of a method 300 for cleaning the capillary tube of the wire bonding assembly machine. In the method 300, the capillary tube does not need to be removed from the wire bonding machine in contrast to the typical capillary tube cleaning methods. The cleaning process can be performed manually (by a human positioning cleaning material adjacent the capillary tube), semi-automatically (in which the process involves some human involvement such as instructing the capillary tube to be cleaned, but the positioning of the cleaning material may be automatically performed) or automatically performed (in which the wire bonding machine may programmatically determine when to perform a capillary tube cleaning and may automatically position the cleaning material to perform the cleaning) on line to refurbish the capillary tube. In one embodiment, the cleaning material may be installed on a clean bock or station at a predefined position. When the cleaning algorithm is initiated manually, semi-automatically or automatically, the machine moves the capillary tube holder to the predefined location where the cleaning material has been installed and then the capillary tube is inserted into the material. The process 300 also can be manually, semi-automatically or automatically performed on line during the bonding operation at regular intervals to keep the capillary tube clean.

In the method 300, when the capillary tube needs to be cleaned, the cleaning material 202 may be placed adjacent to the capillary tube (302). The cleaning material may take various forms. For example, the cleaning material may have a cross linked polymer layer, may have a cleaning layer on top a carrier or substrate or frame so that the cleaning material may be handled as a semiconductor devices being operated on by the wire bonding machine, may have a cleaning layer and one or more intermediate layers underneath the cleaning layer, etc. The cleaning material may also have a textured, featured, or irregular surface such as a WFL or cone shape pattern may also be advantageous to cleaning inside and outside of the capillary tube. The cleaning material may be such that it retains debris from the capillary tube when the capillary tube is inserted into the cleaning material. The cleaning material may preferably include a compliant polymer with embedded abrasive partials such as Probe Polish or a lapping film such as Probe Lap that are commercial products manufactured by International Test Solutions, Inc. In some embodiments, the cleaning material may be always adjacent to the wire bonding machine during the normal wire bonding operation of the machine and then moved into position when the cleaning operation is set to begin.

Once the cleaning material is positioned, an open end of the capillary tube may be inserted into the cleaning material (304) that performs an abrasive action on the surfaces of the capillary tube so that the capillary tube is cleaned and refurbished. This action will dislodge the debris and trap the debris in or on the cleaning material surface. In particular, the insertion of the open end of the capillary tube into the cleaning material may remove debris from around the open end of the capillary tube and inside of the capillary tube and trap/retain the debris in the cleaning material. The above cleaning may be performed periodically. In one example, the capillary tube may be cleaned every 200 to 500 bonds with 5 to 10 insertions per cleaning cycle. The cleaning material may be periodically replaced since the cleaning material retains the debris. The use of this cleaning mythology will increase the time that a capillary tube can be used in the process which will increase the utilization of the capillary tube and the equipment.

Figure 4:
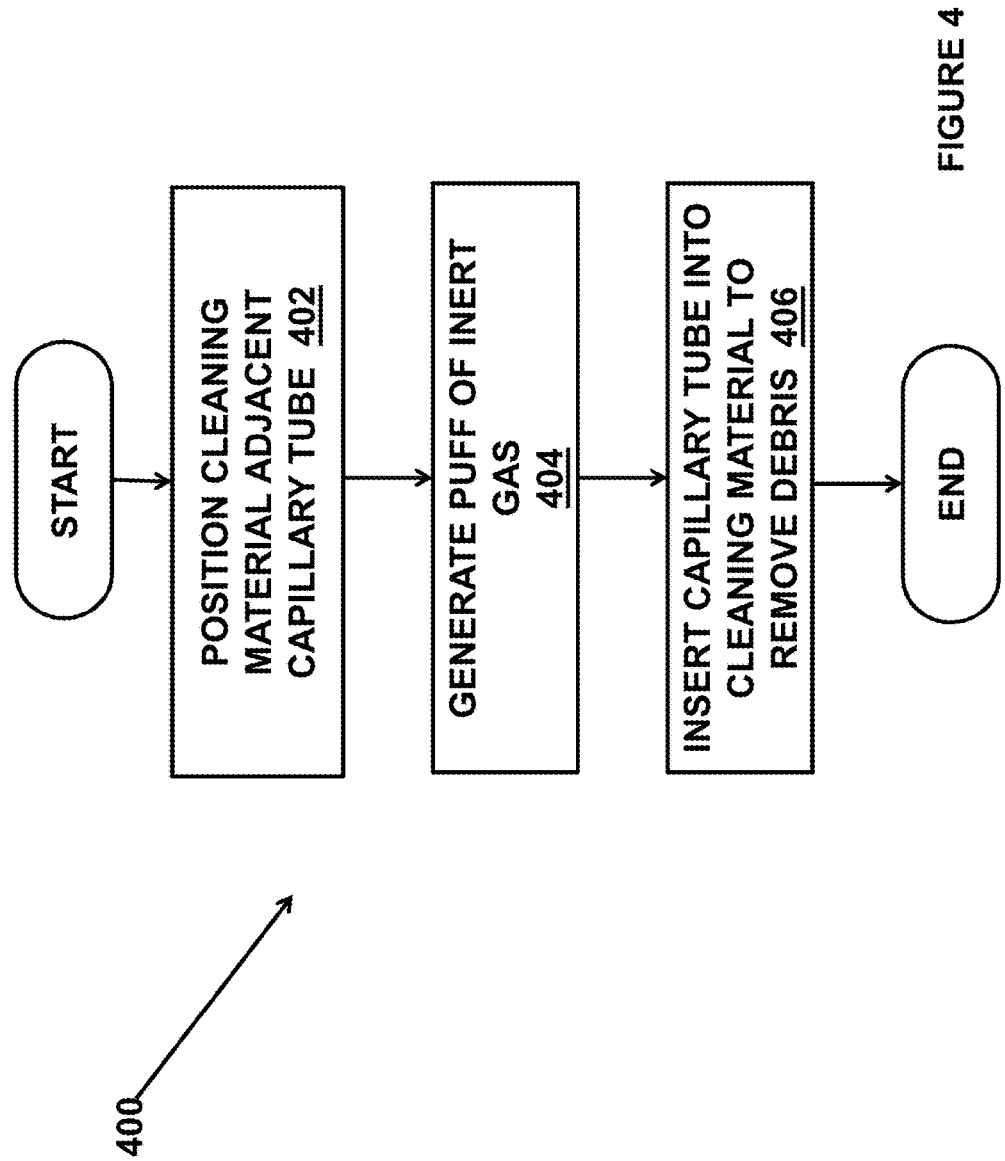
FIG. 4 illustrates a second embodiment of a method for cleaning the capillary tube of the wire bonding assembly machine.

FIG. 4 illustrates a second embodiment of a method 400 for cleaning the capillary tube of the wire bonding assembly machine. The cleaning process can be performed manually (by a human positioning cleaning material adjacent the capillary tube), semi-automatically (in which the process involves some human involvement such as instructing the capillary tube to be cleaned, but the positioning of the cleaning material may be automatically performed) or automatically performed (in which the wire bonding machine may programmatically determine when to perform a capillary tube cleaning and may automatically position the cleaning material to perform the cleaning) off line to refurbish the capillary tube as described above. The process 400 also can be manually, semi-automatically or automatically performed on line during the bonding operation at regular intervals to keep the capillary tube clean.

In this cleaning method, the same cleaning material may be used and the cleaning material may be positioned (402) adjacent the capillary tube as described above. In this method, when the capillary tube is positioned above the cleaning material, a puff of inert gas (404) may be generated from an inert gas source 204 shown in FIG. 2 (that may be part of the wire bonding machine or separate from the wire bonding machine) that blows debris from inside of the capillary tube such that the debris will be trapped on the surface of the cleaning material.

Similar to the method shown in FIG. 3, the capillary tube may be inserted into the cleaning material (406) that performs an abrasive action as described above. As with the above method, the use of this cleaning mythology will increase the time that a capillary tube can be used in the process which will increase the utilization of the capillary tube and the equipment.

FIGS. 5A, 5B, and 5C illustrate three typical different types of cleaning devices manufactured with a cleaning medium applied to various substrate materials, different size substrates, different shape substrates or without a substrate in some applications. As shown in FIGS. 5A and 5B, cleaning device 20 and 21, respectively, may include a substrate 23 and a cleaning medium, or pad, 24 secured, adhered, or applied to a surface of a carrier or to substrate of known geometry, respectively. The substrate 23 may be plastic, metal, glass, silicon, ceramic or any other similar material. Furthermore, a substrate 25 may have a geometry that approximates the geometry of the packaged IC device (DUT) 22. No one is known to has used these typical cleaning devices to clean a capillary tube in a wire bonding process or done so during the normal operation of the machine.

Figure 6A:
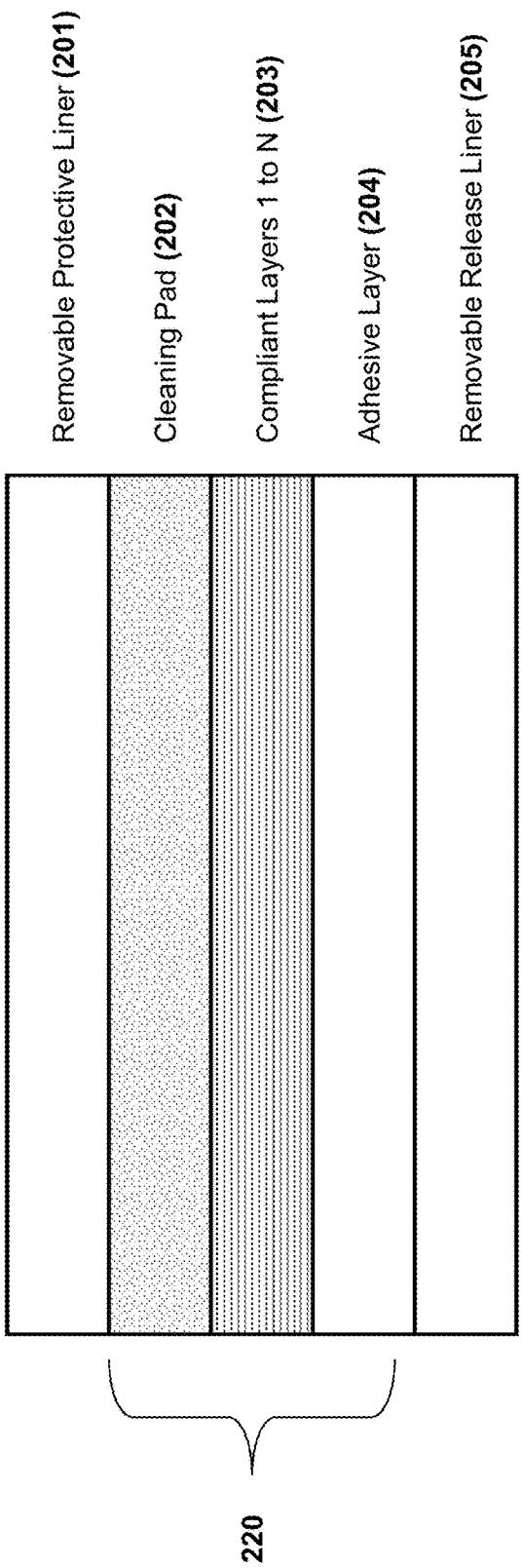
FIG. 6A is a sectional view of a cleaning medium that has one or more intermediate compliant material layers below a cleaning pad layer.

As described above, the wire bonding capillary tube cleaning process and device may use a cleaning medium with one or more intermediate compliant layers is described in more detail with reference to the accompanying drawings and embodiments. In one embodiment (shown in FIG. 6A), a cleaning medium 220 may be made from a cleaning pad layer 202 of predetermined properties, such as hardness, elastic modulus, etc., that contribute to the cleaning of the capillary tube that contact the bond pad or frame. The cleaning medium 220 may also have one or more intermediate compliant layers 203 attached to and below the cleaning pad layer. The combinations of layers produces material properties unavailable from the individual constituent materials, while the wide variety of matrix, abrasive particles, and geometries allows for a product or structure that has to choose an optimum combination to maximize cleaning performance. By adding compliant or microporous foam underlayers beneath a rigid cleaning layer, the overall abrasive wear characteristics of the cleaning material are reduced and/or the tip shaping performance are enhanced in order to extend the overall service life of the capillary tube without compromising the shape or function of the contact geometry. For example, application of the abrasive particle layer onto a rigid polyester film creates a lapping film type cleaning material with stock removal characteristics used to create and maintain the capillary tube. Application of the same abrasive particle layer to the surface of a compliant unfilled polymer or the "skin" side of a microporous foam, results in multi-layered material with preferential stock removal characteristics for creating and maintaining the capillary tube element with a radius or semi-radius contact area geometry. As the overall compliance of the underlayer(s) is systematically increased (or rigidity is decreased), the overall abrasive wear characteristics of the cleaning material transition from creating and maintaining a flat tip contact area geometry to creating and maintaining a radius or semi-radius contact area geometry.

The cleaning medium 220 may also have a removable protective layer 201 that is installed prior to the intended usage for contact element cleaning in order to isolate the surface cleaning pad layer from non-test related contaminants. The removable protective layer 201 protects the working surface of the cleaning pad layer 202 from debris/contaminants until the cleaning device is ready to be used for cleaning a capillary tube. When the cleaning device is ready to be used for cleaning the capillary tube, the removable protective layer 201 may be removed to expose the working surface of the cleaning pad layer 202. The protective layer may be made of a known non-reactive polymeric film material and preferably made of a polyester (PET) film. The protective layer may have a matte finish or other "textured" features to improve the optical detection of the cleaning device by the assembly equipment and/or improve cleaning efficiency.

Installation of the cleaning device onto the predetermined substrate material is performed by removal a second release liner layer 205 (made of the same material as the first release liner layer) to expose the adhesive layer 204, followed by application onto the substrate surface by the adhesive layer 204. The adhesive layer 204 may then be placed against a substrate adhere the cleaning device 220 to the substrate. The substrate may be a variety of different materials as described in the prior art which have different purposes.

The cleaning pad layer 202 described above and the cleaning pad layers described below may provide predetermined mechanical, material, and dimensional characteristics to the cleaning material. For example, the cleaning pad layer may provide abrasiveness (described in more detail below), a specific gravity (of a range of 0.75 to 2.27 for example) wherein specific gravity is the ratio of the density to the density of water at a particular temperature, elasticity (of a range of 40-MPa to 600-MPa for example), tackiness (of a range of 20 to 800 grams for example), planarity, and thickness (a range between 25-um and 500-um for example).

The one or more intermediate layers (which can be compliant as described above, rigid as described below or a combination of compliant and rigid layers as described below) may provide predetermined mechanical, material, and dimensional characteristics to the cleaning material. For example, the one or more intermediate layers may provide abrasiveness (described in more detail below), a specific gravity (of a range of 0.75 to 2.27 for example) wherein specific gravity is the ratio of the density of the one or more intermediate layers to the density of water at a particular temperature, elasticity (of a range of 40-MPa to 600-MPa for example), tackiness (of a range of 20 to 800 grams for example), planarity, thickness (a range between 25-um and 500-um for example), and/or porosity (a range of 10 to 150 micropores per inch for example) which is an average number of pores per inch.

Figure 6B:
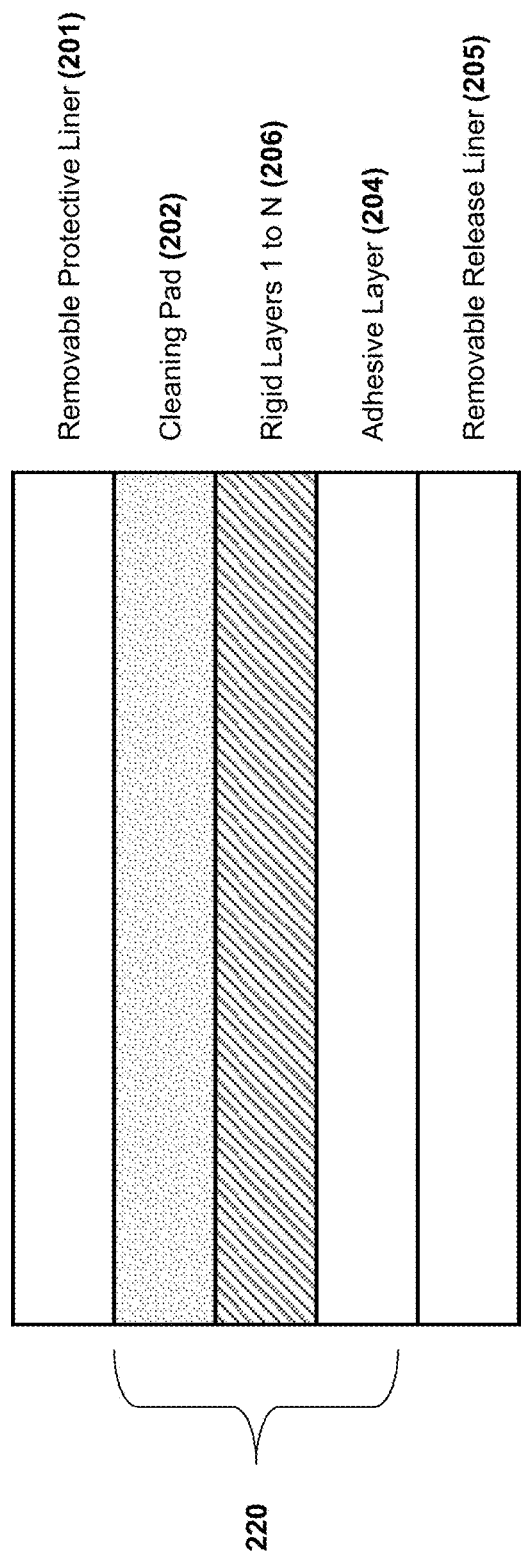
FIG. 6B is a sectional view of a cleaning medium with one or more intermediate rigid material layers below a cleaning pad layer of predetermined properties.
Figure 6C:
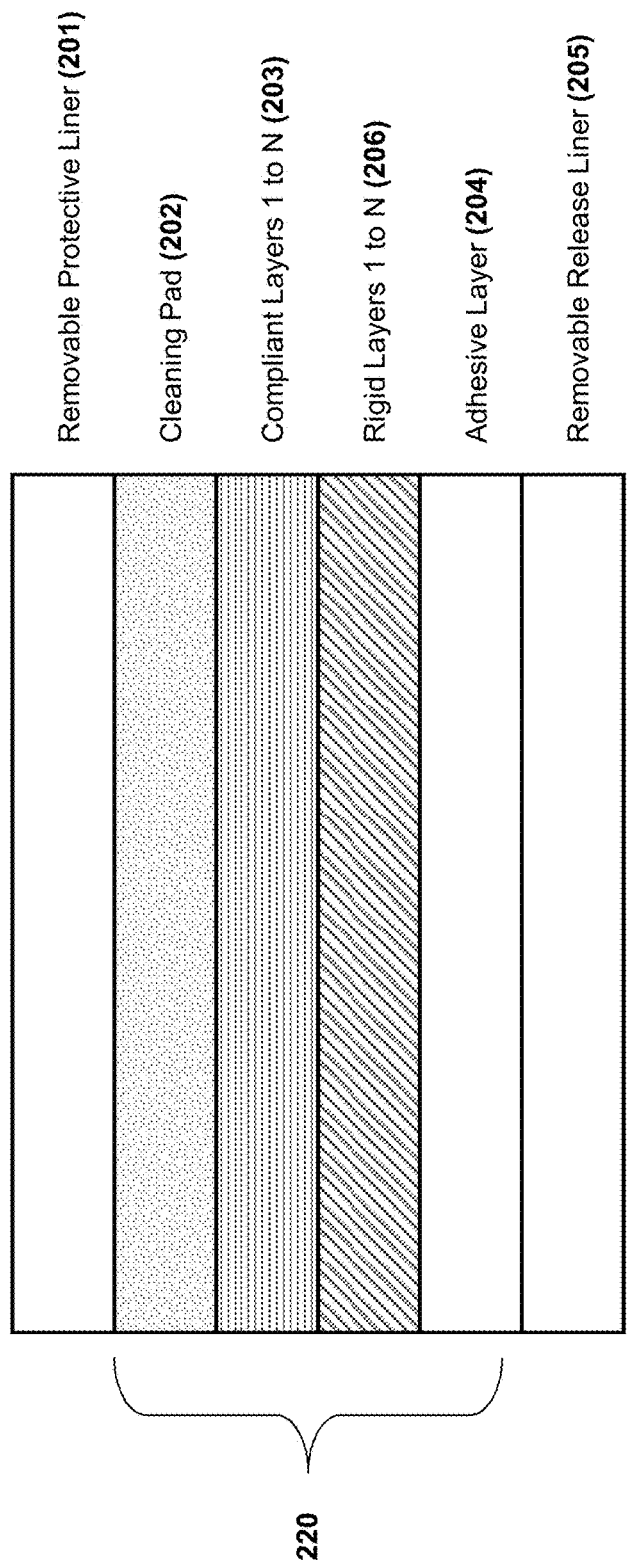
FIG. 6C is a sectional view of a cleaning medium that has one or more intermediate rigid and compliant material layers beneath a cleaning pad layer of predetermined properties.
Figure 6D:
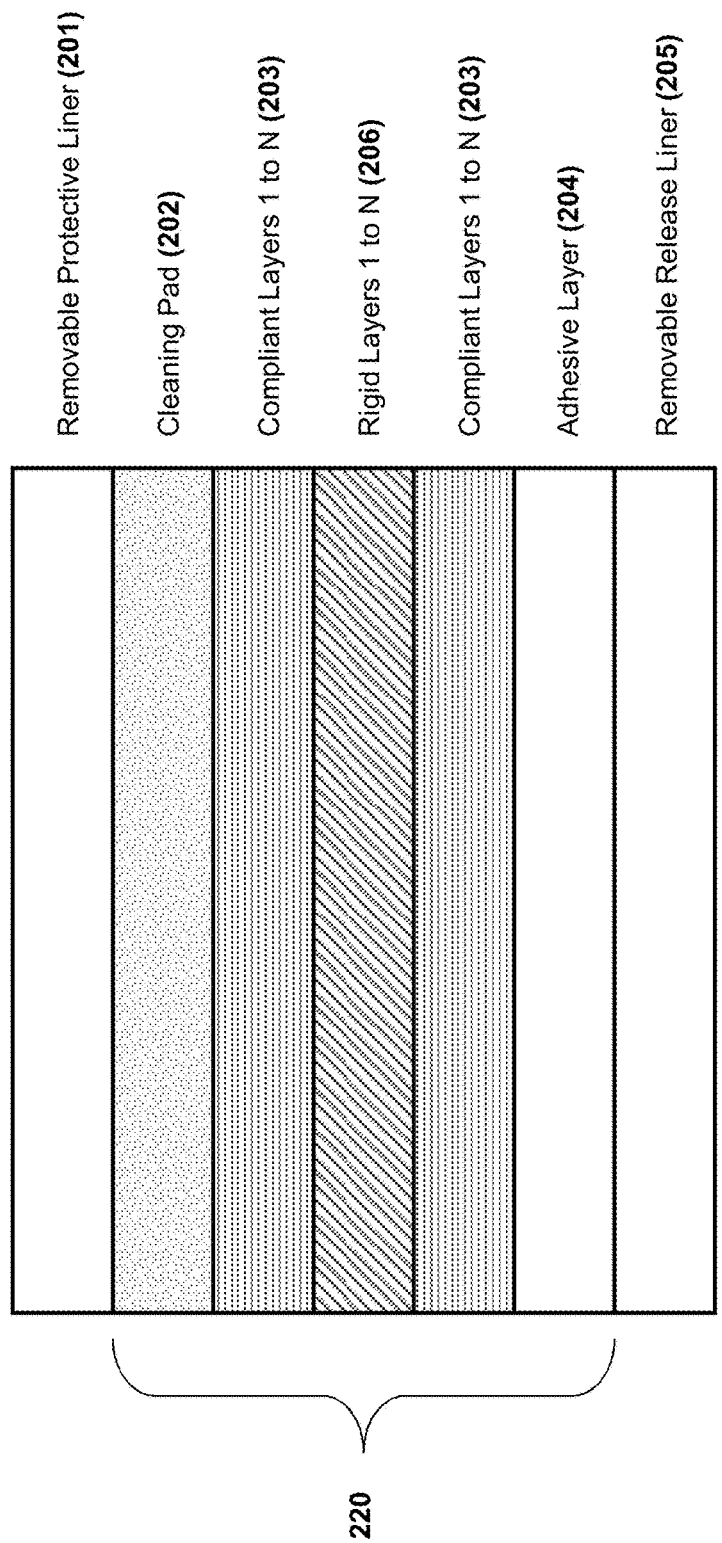
FIG. 6D is a sectional view of a cleaning medium with one or more alternating intermediate rigid and compliant material layers beneath a cleaning pad layer of predetermined properties.

In another embodiment shown in FIG. 6B, a cleaning medium 220 may be made from a cleaning pad layer 202 with one or more intermediate rigid layers 206 below the cleaning pad layer 202. For another embodiment (FIG. 6C), the cleaning medium 220 may be constructed using a combination of one or more intermediate rigid 206 and compliant 203 material layers beneath a cleaning pad layer 202 of predetermined properties. FIG. 6D shows an embodiment wherein the cleaning medium 220 is constructed by alternating one or more intermediate rigid 206 and compliant material layers 203 beneath a cleaning pad layer 202 of predetermined properties. The cleaning pad 202 and underlayers (203, 206, etc.) will have predetermined abrasive, density, elasticity, and/or tacky properties that contribute to cleaning the capillary tube with known geometrical configurations. Superposition of the cleaning layer and intermediate material layer properties may be varied according the specific configuration and geometrical features of the contact element.

Abrasiveness of the cleaning pad layer 202 will loosen and shear debris from the capillary tube. Using predetermined volumetric and mass densities of abrasive particles; the abrasiveness of the pad can be systematically affected in order to round or sharpen the capillary tube. Typical abrasive material and particle weight percentage loading within the cleaning material layer can range for 30% to 500% weight percent. As used herein, weight percent polymer loading is defined as the weight of polymer divided by the weight of polymer plus the weight of the abrasive particle. Typical abrasives that may be incorporated into the materials may include aluminum oxide, silicon carbide, and diamond although the abrasive material may also be other well-known abrasive materials. The abrasive may include spatially or preferentially distributed particles of aluminum oxide, silicon carbide, or diamond although the abrasive particles may also be other well-known abrasive materials with Mohs Hardness of 7 or greater. Controlled surface tackiness of the cleaning layer will cause debris on the contact element to preferentially stick to the pad and therefore be removed from the contact element during the cleaning operation.

In one embodiment, the cleaning material layer, and/or the intermediate rigid layers, and/or intermediate compliant layers (each being a "material layer") may be made of a solid or foam-based, with open or closed cells, elastomeric materials that may include rubbers and both synthetic and natural polymers. Each material layer may have a modulus of Elasticity with a range between more than 40-MPa to less than 600-MPa and the range of thickness of the layers may be between 25-um or more and less than or equal to 500-um. Each material layer may have a hardness range of layers between 30 Shore A or more and not to exceed 90 Shore A. The cleaning and adhesive layers may have a service range of between −50 C to +200 C. Each elastomeric material may be a material manufactured with a predetermined tackiness or abrasive particles spatially or preferentially distributed within the body of the material. Each material may have a predetermined elasticity, density and surface tension parameters that may allow the capillary tube to penetrate the elastomeric material layers and remove the debris on the capillary tube without damage to the geometrical features of the capillary tube, while retaining the integrity of the elastomeric matrix. Each material layer will have a predetermined thickness generally between 1 and 20 mils thick. The thickness of each layer may be varied according the specific configuration of the capillary tube. For example, a thin material cleaning material layer (~1-mil thick) would be suitable for a "non-penetrating" capillary tube geometry such as a flat tube and a thick material cleaning layer (~20-mil) would be well-suited for a "penetrating" tube geometry such as a spear-point. As one or more assembly elements and supporting hardware of the assembly equipment the cleaning pad during the normal operation of the automated, semi-automated, or manual cleaning, a vertical contact force drives the contact element into the pad where the debris on and in the capillary tube will be removed and retained by the pad material.

Figure 7A:
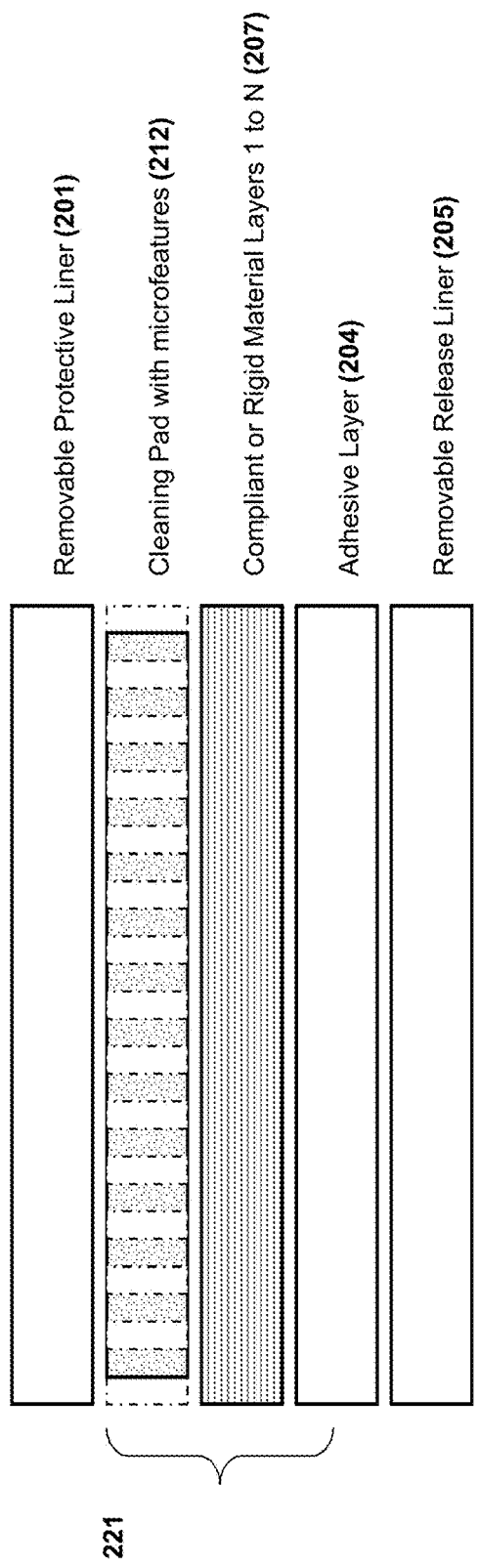
FIG. 7A is a sectional view of a cleaning material with evenly spaced micro-columns of a predetermined geometry constructed onto one or more material layers of predetermined properties.
Figure 7B:
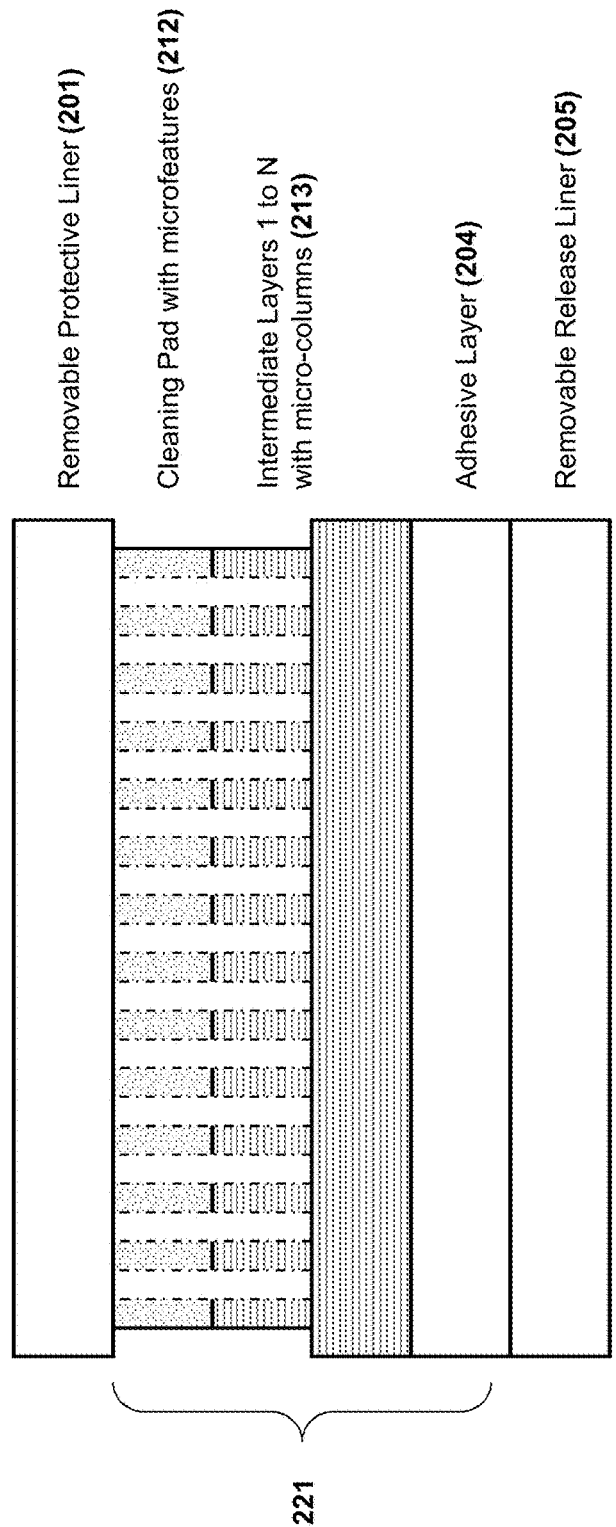
FIG. 7B is a sectional view of a cleaning material with evenly spaced micro-columns of a predetermined geometry constructed from a combination of one or more intermediate rigid and compliant material layers of predetermined properties.

In other embodiments of the cleaning medium 221 (shown in FIGS. 7A and 7B), the maximum cleaning efficiency of the cleaning material can be improved using a plurality of uniformly shaped and regularly spaced, geometric micro-features, such as micro-columns 212 or micro-pyramids, of a pre-determined aspect ratio (diameter to height), cross-section (square, circular, triangular, etc.). In FIG. 7A, the spaced microfeatures are constructed from a single layer 212 across a combination of intermediate compliant or rigid layers 207 with pre-determined predetermined properties. As an example of one type of micro-feature construction, the square micro-columns shown in FIG. 5A 7A? can be created using a combination of precision fabrication and controlled cutting methods whereby the major axis has a dimension of 100-micron and the "street" and "avenue" widths are less than 50-um. The depth of the "streets" and "avenues" is controlled by the cutting methods in order to attain the aspect ratio. In this example, the features have a 100-micron major axis width to a 200-micron depth (or height). In this construction, the depth is attained without cutting through the cleaning material layer or into the underlayer(s). In FIG. 7B, the evenly spaced microfeatures may be constructed from multiple layers 213 of intermediate compliant or rigid layers 207 with predetermined properties. The size and geometry of the microfeatures may vary according the configuration and material of the capillary tube to achieve a pad that will remove the debris but will not damage the capillary tube. If the microfeatures are large relative to the contact element geometry, this will adversely affect the cleaning performance. If the micro-features are small relative to the contact element geometry, the reciprocal force will be insufficient to facilitate a high cleaning efficiency to remove adherent contaminants.

Generally, the microfeatures can have several types of geometries including (cylinders, squares, triangles, rectangles, etc. The cross-sectional size in major axis of each micro-feature may be greater than or equal to 25-um and smaller than 500-um and each micro-feature may have an aspect ratio (height to width) that ranges between 1:10 to 20:1. The micro-feature geometry may be adjusted during the manufacturing of a cleaning layer such that the material can be used reshape, sharpen or refurbish the capillary tube tips.

Figure 8A:
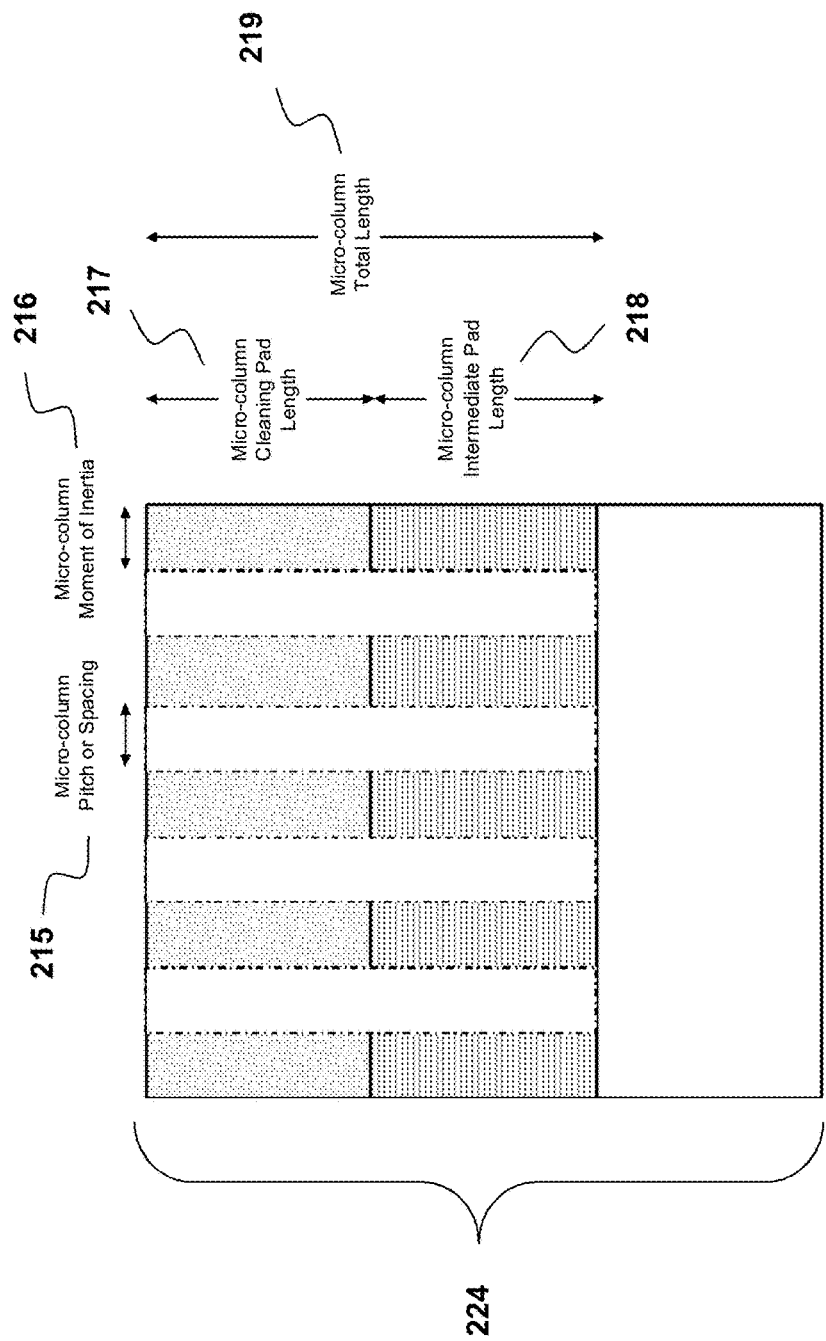
FIG. 8A is an enlarged sectional view of a evenly spaced micro-columns constructed from a combination of one or more intermediate material layers to attain a consistent cleaning efficacy into the contact area of a capillary tube.
Figure 8B:
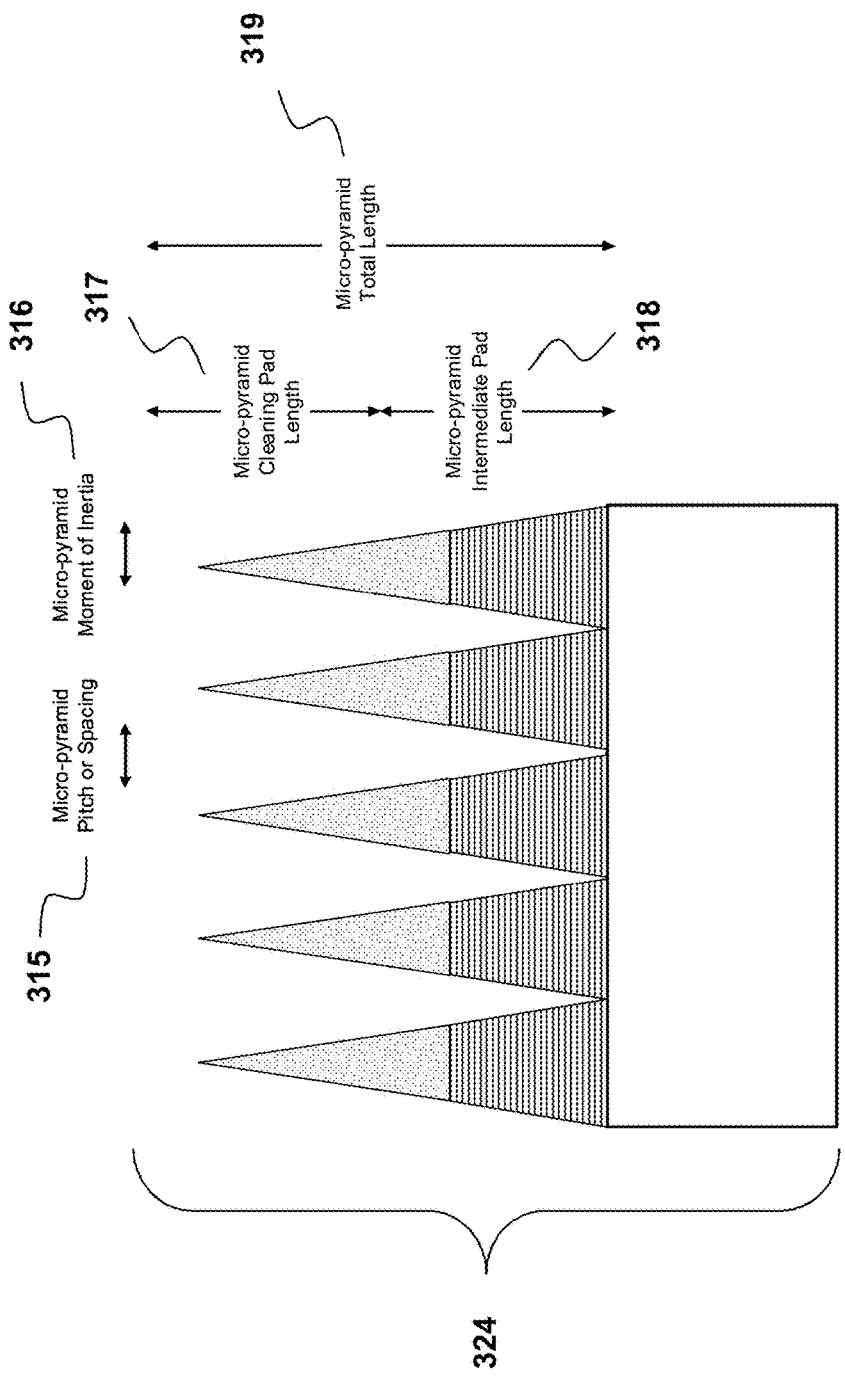
FIG. 8B is an enlarged sectional view of a evenly spaced micro-pyramids constructed from a combination of one or more intermediate material layers to attain a consistent cleaning efficacy into the contact area of a capillary tube.

In an embodiment, FIG. 8A and FIG. 8B show enlarged sectional views of a cleaning materials with micro-features (micro-columns 219 and micro-pyramidal 319 features of the cleaning material 224, 324, respectively); although, such features also could be any other regular geometrical feature. The deflection of a micro-feature under load depends not only on the load, but also on the geometry of the feature's cross-section.

In FIG. 8A, the micro-column spacing, or pitch, 215; the area moment of inertia or the second moment of inertia which is a property of a shape that can be used to predict the resistance of features to bending and deflection, 216; the cleaning pad length 217; the intermediate pad length 218; and the total length of the micro-column 219 are predetermined according the specific configuration of the contact element and the supporting hardware. For the capillary tube, the micro-column geometry is such that the cleaning features can fit "in-between" or inside of the capillary tube as well as make physical contact with the capillary tube to provide cleaning action and debris collection along the sides of the capillary tube. In this example, the capillary tube design could have a spacing (or pitch) of 125-microns. For the cleaning material, the feature major cross-sectional axis length would be less than 125-micron and the height would be at least 60-micron to facilitate overtravel into the cleaning material. FIG. 8B, the micro-pyramid vertex spacing, or pitch, 315 and the variable moment of inertia 316 along the height, the cleaning pad pyramidal length 317, the pyramidal frustum height 318, and the total height of the micropyramid 319 are predetermined according the specific configuration of the capillary tube. As an example, the micropyramid geometry is such the cleaning material can fit into the capillary tube to provide cleaning action and debris collection inside the capillary tube and along the sides of the capillary tube. For a particular capillary tube, the microfeature geometry is such that the cleaning features can fit into the capillary tube and along the sides of the capillary tube to provide cleaning action and debris collection along the sides of the capillary tube. The shape of the microfeature would be defined by the kerf (i.e, "street width and shape", and "avenue width and shape") if a precision cutting process is used or through a molded shape if a casting process is used. For the micro-features of the cleaning material, the major cross-sectional axis length of the microfeature top surface would be less than 125-micron to facilitate within contactor cleaning. The overall height would be at least 200-micron to facilitate overtravel into the cleaning material and provide a sufficient reciprocal force to initiate the cleaning and/or material removal action.

The micro-features may have abrasive particles applied to the top surface, along the length of the micro-feature, within the body of the micro-feature, or at the base of the microfeature. In one embodiment, an average micro-feature could have a cross-section widths of 1.0-µm or more, with a height of 400-µm or less and an average abrasive particle size of less than 15.0 µm. Typical abrasives that may be incorporated into and across the material layers and micro-features may include aluminum oxide, silicon carbide, and diamond although the abrasive particles may also be other wellknown abrasive materials with Mohs Hardness of 7 or greater. The amount and size of the abrasive material added to the micro-features may vary according the configuration and material of the capillary tube to achieve a pad that will remove and collect the debris but will not damage the capillary tube.

Figures 9A, 9B, 9C:
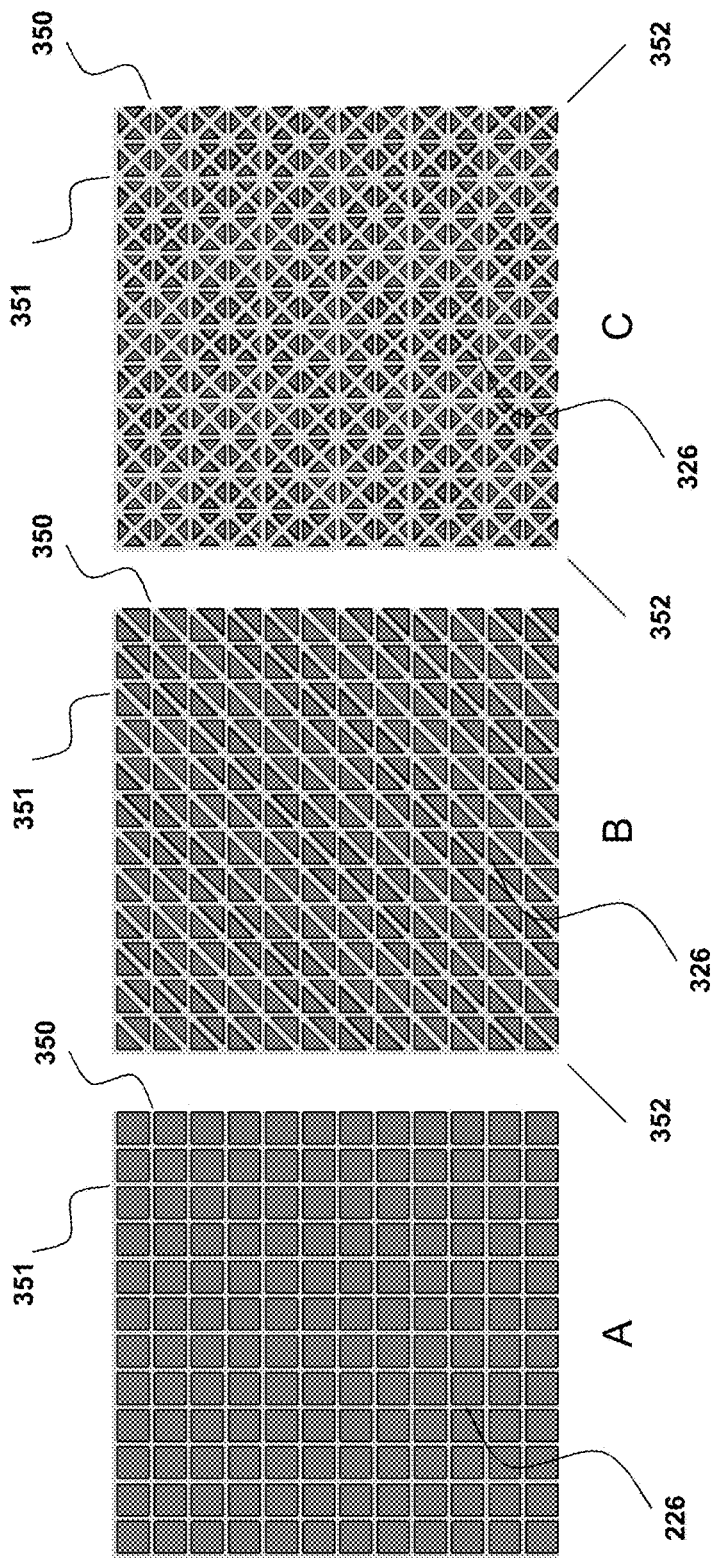
FIG. 9A is a plan view of a portion of mutually decoupled micro-features using an array of "streets" for resultant second moment of area or inertia to control the resistance to bending.
FIG. 9B is a plan view of a portion of mutually decoupled micro-features using an array of "avenues" for resultant second moment of area or inertia to control the resistance to bending.
FIG. 9C is a plan view of a portion of mutually decoupled micro-features using an array of diagonals for second moment of area or inertia to control the resistance to bending.

FIGS. 9A, 9B, and 9C are diagrams illustrating an embodiment of the cleaning material 224 and 324, respectively, in which the micro-features are mutually decoupled and formed with a predetermined moment of inertia using predetermined arrays of streets 351, avenues 352, and diagonals 353 to remove undesirable interactions and other coupled effects and attain a predetermined surface compliance so that when the capillary tube elements contact the pad surface, a reciprocal force is imparted by the material into the contact area, within the contact element tip geometry, and support structures to increase the efficiency at which the debris and contaminates are removed. The widths of the streets, avenues, and diagonals size may vary according the configuration and material of the capillary tube to achieve a decoupled material surface to uniformly remove the debris from the sides of the contact element and within the geometrical features contact element tip. The streets, avenues, and diagonals may have abrasive particles uniformly or preferentially distributed across the width. The width of the streets, avenues, and diagonals as well as the size of the abrasive material across the width may vary according the configuration and material of the capillary tube.

The cleaning system and cleaning pad not only removes and collects adherent particulates from the capillary tube, but maintains the shape and geometric properties of capillary tube. The insertion of the capillary tube of the wire bonder into a cleaning device, such as the devices shown in FIG. 3A carrier device 20; FIG. 3B substrate device 21; and FIG. 3C dummy package device 22, removes adherent debris from the capillary tube element and supporting hardware without leaving any organic residue that must be subsequently removed with an additional on-line of off-line process.

Now, a method for cleaning the capillary tube will be described. The method accomplishes the goal of removing the debris from capillary tube without removing the capillary tube from the wire bonding machine, thereby increasing the productivity of the wire bonding machine. The cleaning material is installed on a clean bock or station at a predefined position and when the cleaning algorithm is initiated manually, semi-automatically or automatically the machine moves the capillary tube holder to the predefined location where the cleaning material has been installed and then the cap tube is inserted into the material that may have the same size and shape as typic, may be inserted into clean material. The cleaning material layer of the device has predetermined physical, mechanical, and geometrical properties according the configuration and material of the capillary tube.

Figure 10A:
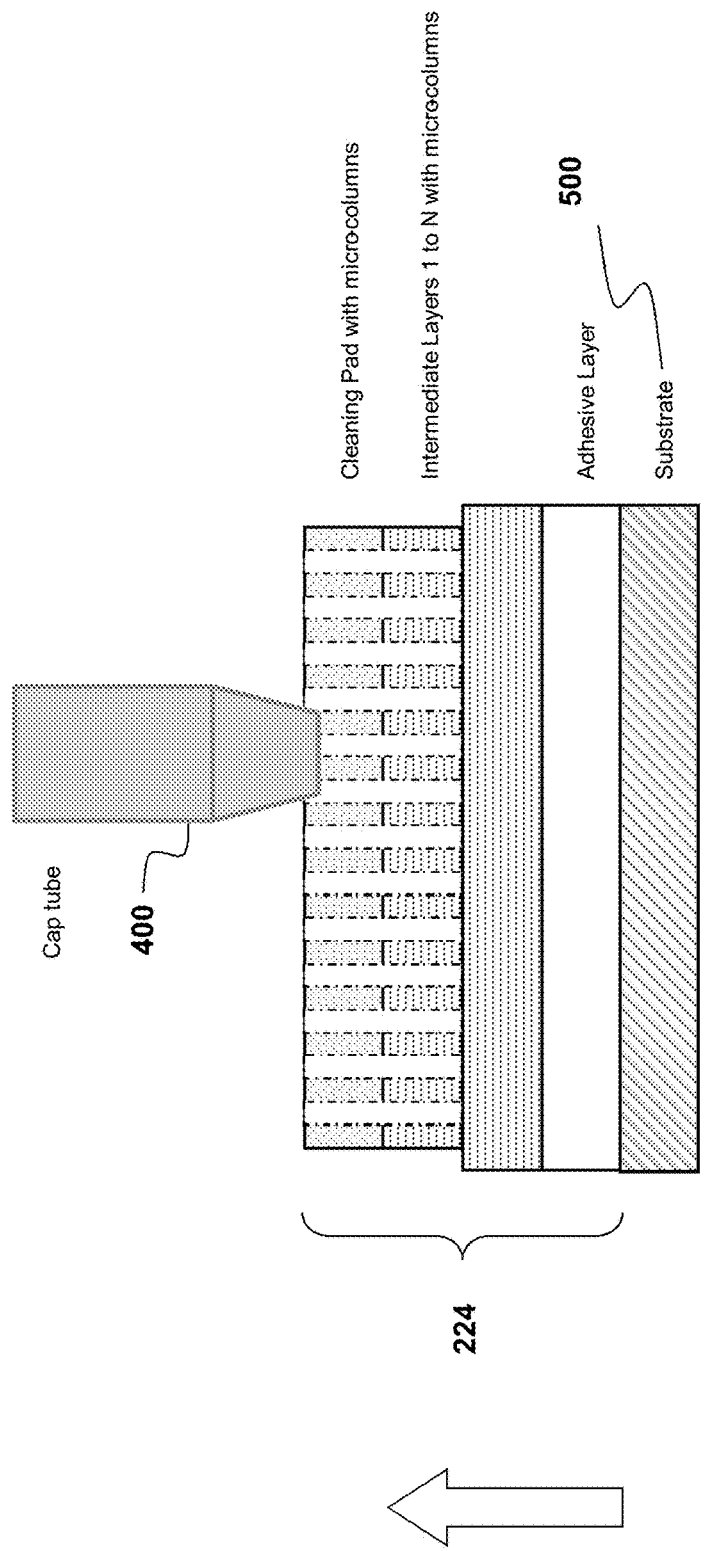
FIG. 10A is a sectional view of a cleaning material with micro-columns for cleaning the capillary tube of a wire bonding machine.
Figure 10B:
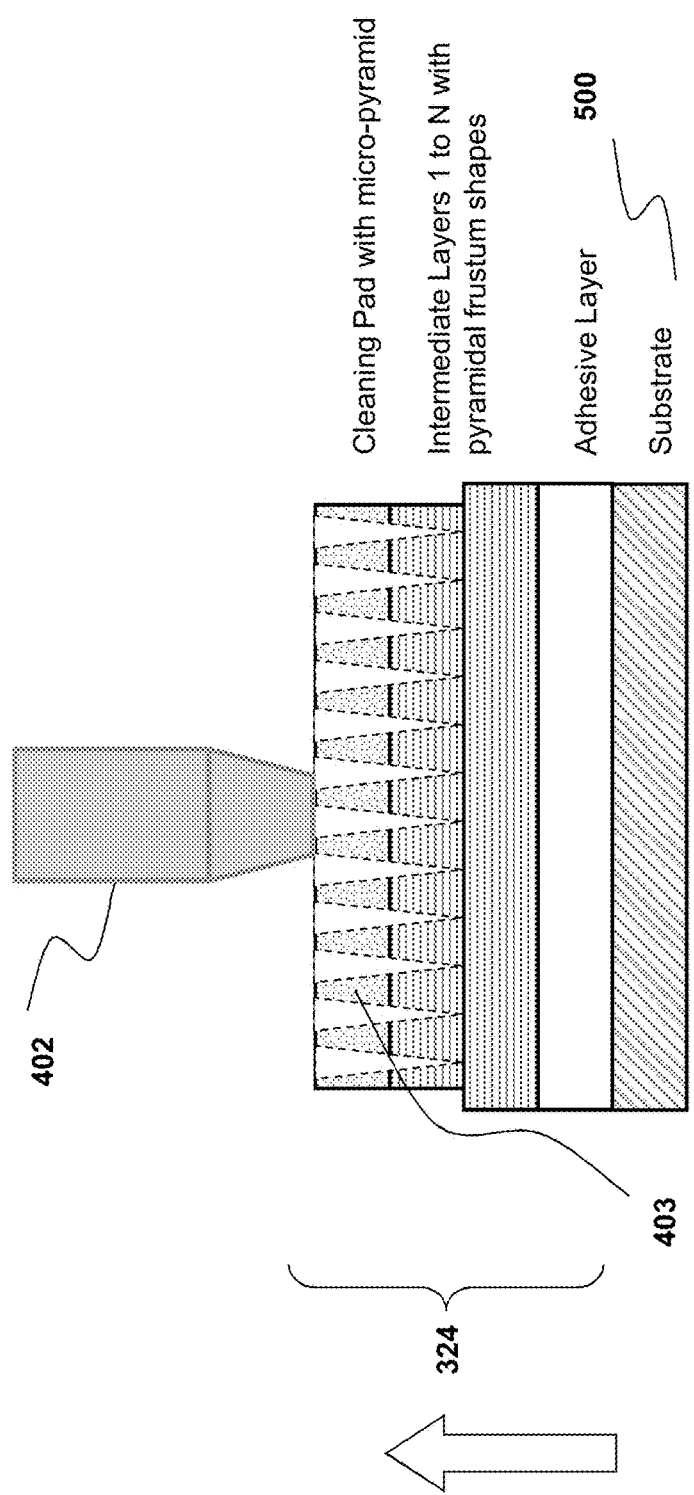
FIG. 10B is a sectional view of a cleaning material with micro-pyramids for cleaning the capillary tube.
Figure 10C:
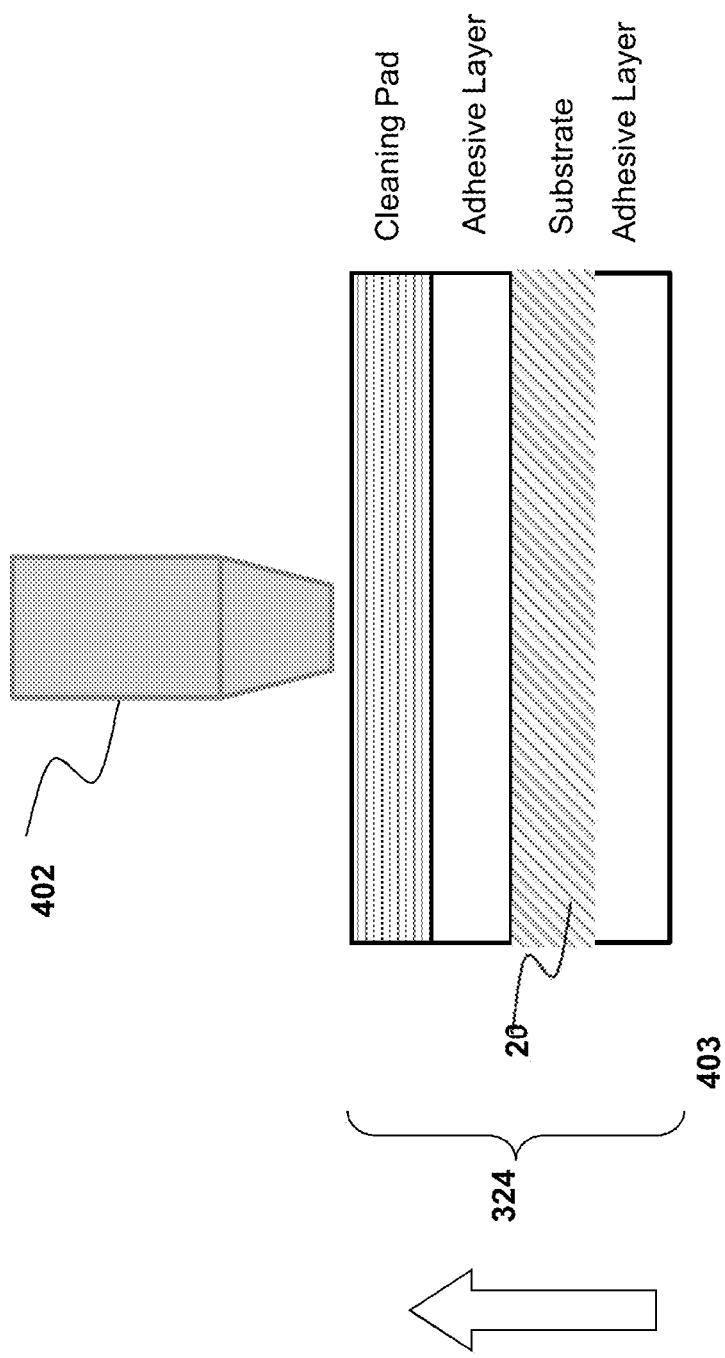
FIG. 10C is a sectional view of a cleaning material with a carrier substrate for cleaning the capillary tube.

An embodiment of the cleaning material with the microfeatures suitable for cleaning the capillary tube 400 is shown in FIG. 10A. For this illustrative example, a standard capillary tube is shown but not the other well-known elements of a wire bonding machine. The cleaning material 224 is installed onto a carrier substrate 20 (as shown in FIG. 10C) or a cleaning area substrate 500 (as shown in FIG. 10B). For example, the cleaning material may be installed on a cleaning block or pad (the carrier 20) of the wire bonding machine and the bonder head with the capillary tube installed may be programmed to move (manually, semi-automatically and/or automatically) to a location of the cleaning block/pad so that the capillary tube may be inserted into the cleaning material.

Thus, at a specified interval, the capillary tube is cleaned when the cleaning material 224 is driven in contact with the capillary tube to some pre-set vertical position. The spacing 215, moment of inertia 216, and total length 219 of the micro-columns configured based on the configuration and material of the capillary tube 400. As the capillary tube 400 are exercised into the cleaning material 224, debris is removed from the surface of the capillary tube as well as inside of the capillary tube. The spacing, geometry, and abrasiveness of the micro-columns is such that the reciprocal pressure on the capillary tube imparts efficient cleaning to remove and collect debris from the capillary tube.

As described above, this cleaning step may occur when the wire bonding machine executes a cleaning operation of the capillary tube with the cleaning material installed onto the burnishing plate. The cleaning operation does not effect in any way, the operation of the wire bonding machine since the cleaning of the capillary tube is accomplished during the normal operation of the wire bonding machine. In this manner, the cleaning operation is inexpensive and permits the capillary tube to be cleaned and/or shaped without removing the capillary tube from the wire bonding machine.

In the micro-featured embodiment shown in FIG. 10B, the micro-pyramid structures 324 may be used wherein the geometrical features of the cleaning device have spacing, geometry, and abrasiveness is such that the reciprocal pressure on the capillary tube 402 imparts efficient cleaning to remove and collect debris from the within the center of capillary tube. Decoupling of the micro-pyramid structures 326, with streets 350, avenues 351, and diagonals 352, with widths and depths is predetermined according to the configuration and material of the capillary tube. The spacing, geometry, and abrasiveness of the micro-pyramids is such that the reciprocal pressure on the capillary tube imparts efficient cleaning to remove and collect debris from the capillary tube. Thus, the number of pad/polymer/substrate layers and surface micro-features may be controlled to provide control of the overall thickness of the cleaning device as well as the compliance of the thickness of the cleaning. This multi-layer embodiment would also provide "edge-side" cleaning for the interior of the capillary tube.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

The system and method disclosed herein may be implemented via one or more components, systems, servers, appliances, other subcomponents, or distributed between such elements. When implemented as a system, such systems may include an/or involve, inter alia, components such as software modules, general-purpose CPU, RAM, etc. found in general-purpose computers. In implementations where the innovations reside on a server, such a server may include or involve components such as CPU, RAM, etc., such as those found in general-purpose computers.

Additionally, the system and method herein may be achieved via implementations with disparate or entirely different software, hardware and/or firmware components, beyond that set forth above. With regard to such other components (e.g., software, processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to: software or other components within or embodied on personal computers, servers or server computing devices such as routing/connectivity components, handheld or laptop devices, multiprocessor systems, microprocessor-based systems, set top boxes, consumer electronic devices, network PCs, other existing computer platforms, distributed computing environments that include one or more of the above systems or devices, etc.

In some instances, aspects of the system and method may be achieved via or performed by logic and/or logic instructions including program modules, executed in association with such components or circuitry, for example. In general, program modules may include routines, programs, objects, components, data structures, etc. that perform particular tasks or implement particular instructions herein. The inventions may also be practiced in the context of distributed software, computer, or circuit settings where circuitry is connected via communication buses, circuitry or links. In distributed settings, control/instructions may occur from both local and remote computer storage media including memory storage devices.

The software, circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules and/or other components. Further, communication media may include wired media such as a wired network or direct-wired connection, however no media of any such type herein includes transitory media. Combinations of the any of the above are also included within the scope of computer readable media.

In the present description, the terms component, module, device, etc. may refer to any type of logical or functional software elements, circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive, etc.) to be read by a central processing unit to implement the functions of the innovations herein. Or, the modules can comprise programming instructions transmitted to a general purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, features consistent with the disclosure may be implemented via computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may also be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) though again does not include transitory media. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the applicable rules of law.

While the foregoing has been with reference to a particular embodiment of the disclosure, it will be appreciated by those skilled in the art that changes in this embodiment may be made without departing from the principles and spirit of the disclosure, the scope of which is defined by the appended claims.

The invention claimed is:

1. A method for cleaning a wire bonding machine, comprising:
    positioning a capillary tube that is connected to a wire bonding machine near an elastomeric cleaning material; and
    inserting, while the capillary tube remains attached to the wire bonding machine, the capillary tube into the elastomeric cleaning material so that an end of the capillary tube penetrates the elastomeric cleaning material that removes debris from the capillary tube.

2. The method of claim 1 further comprising causing an inert gas to pass through the capillary tube to push debris inside of the capillary tube into the elastomeric cleaning material.

3. The method of claim 1 further comprising moving the elastomeric cleaning material adjacent to the capillary tube of the wire bonding machine.

4. The method of claim 1 further comprising trapping the debris within the elastomeric cleaning material.

5. The method of claim 1, wherein positioning the elastomeric cleaning material further comprises positioning an elastomeric cleaning device having a cross linked polymer layer.

6. The method of claim 1, wherein positioning the elastomeric cleaning material further comprises positioning an elastomeric cleaning device having a cross linked polymer layer and one or more intermediate layers having predetermined characteristics.

7. The method of claim 1, wherein positioning the elastomeric cleaning material further comprises using a handler to position the elastomeric cleaning material when removing debris from the capillary tube and further comprising using the handler to move a plurality of semiconductor devices during a wire bonding process.

8. The method claim 1 further comprising attaching the elastomeric cleaning material to a carrier.

9. The method of claim 8, wherein the carrier is one of a wire bonding machine cleaning block and a wire bonding machine cleaning pad and wherein positioning the capillary tube further comprises moving a head of the wire bonding machine having the capillary tube into proximity of one of the wire bonding machine cleaning block and the wire bonding machine cleaning pad.

10. A method for operating a wire bonding machine, comprising:
    performing a plurality of wire bonding operations using a capillary tube and a wire that passes through the capillary tube; and
    periodically inserting, while the capillary tube remains attached to the wire bonding machine, the capillary tube into an elastomeric cleaning material so that an end of the capillary tube penetrates the elastomeric cleaning material that removes debris from the capillary tube.

11. The method of claim 10 further comprising causing an inert gas to pass through the capillary tube to push debris inside of the capillary tube into the elastomeric cleaning material.

12. The method of claim 10 further comprising moving the elastomeric cleaning material adjacent to the capillary tube of the wire bonding machine.

13. The method of claim 10 further comprising trapping the debris within the elastomeric cleaning material.

14. The method of claim 10, wherein positioning the elastomeric cleaning material further comprises positioning an elastomeric cleaning device having a cross linked polymer layer.

15. The method of claim 10, wherein positioning the elastomeric cleaning material further comprises positioning an elastomeric cleaning device having a cross linked polymer layer and one or more intermediate layers having predetermined characteristics.

16. The method of claim 10, wherein positioning the elastomeric cleaning material further comprises using a handler to position the elastomeric cleaning material when removing debris from the capillary tube and further comprising using the handler to move a plurality of semiconductor devices during a wire bonding process.

17. The method claim 10 further comprising attaching the elastomeric cleaning material to a carrier.

18. The method of claim 17, wherein the carrier is one of a wire bonding machine cleaning block and a wire bonding machine cleaning pad and the method further comprising moving a head of the wire bonding machine having the capillary tube into proximity of one of the wire bonding machine cleaning block and the wire bonding machine cleaning pad.

19. A wire bonding apparatus, comprising:
a wire bonding machine having a capillary tube through which a wire is threaded for creating wire bonds for semiconductor devices; and
an elastomeric cleaning material associated with the wire bonding machine into which an end of the capillary tube penetrates while still attached to the wire bonding machine to refurbish the capillary tube and remove debris from in and around the capillary tube.

20. The apparatus of claim 19, wherein the wire bonding machine further comprises a wire bonding machine having ultrasonic assist.

21. The apparatus of claim 19 further comprising an inert gas source that passes through the capillary tube to push debris inside of the capillary tube into the elastomeric cleaning material.

22. The apparatus of claim 19, wherein the elastomeric cleaning material further comprises a cross linked polymer layer.

23. The apparatus of claim 19, wherein the elastomeric cleaning material further comprises an elastomeric cleaning device having a cleaning layer and one or more intermediate layers underneath the cleaning layer, wherein the one or more intermediate layers having predetermined characteristics.

24. The apparatus of claim 19, wherein the elastomeric cleaning material further comprises one of a carrier, a substrate and a frame having an elastomeric cleaning layer.

25. The apparatus of claim 24 further comprising a handler that handles a plurality of semiconductor devices being wire bonded by the wire bonding machine and that handles the elastomeric cleaning device when the capillary tube is being cleaned.

26. The apparatus of claim 19, wherein the elastomeric cleaning material further comprises a carrier and an elastomeric cleaning layer wherein the capillary tube is inserted into the elastomeric cleaning layer.

27. The apparatus of claim 26, wherein the carrier is one of a wire bonding machine cleaning block and a wire bonding machine cleaning pad and further comprising a machine that moves the capillary tube into proximity of one of the wire bonding machine cleaning block and the wire bonding machine cleaning pad.

28. The apparatus of claim 19, wherein the elastomeric cleaning material has a specific gravity, an elasticity, a tackiness, a thickness and a porosity.

29. The apparatus of claim 28, wherein the specific gravity is in a range of 0.75 to 2.27, the elasticity is in a range of 40-MPa to 600-MPa, the tackiness is in a range of 20 to 800 grams, the thickness is in a range between 25-um and 500-um and the porosity is in a range of 10 to 150 micropores per inch.

30. The apparatus of claim 19, wherein the elastomeric cleaning material is one of a rubber, a natural polymer and a synthetic polymer.

* * * * *